United States Patent
Park

(10) Patent No.: US 9,330,744 B2
(45) Date of Patent: May 3, 2016

(54) MRAM WITH MAGNETIC MATERIAL SURROUNDING CONTACT PLUG

(71) Applicant: SK hynix Inc., Icheon-Si (KR)

(72) Inventor: Ji-Ho Park, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/448,695

(22) Filed: Jul. 31, 2014

(65) Prior Publication Data

US 2015/0262637 A1    Sep. 17, 2015

(30) Foreign Application Priority Data

Mar. 12, 2014  (KR) .................... 10-2014-0028754

(51) Int. Cl.
G11C 11/16 (2006.01)
H01L 43/08 (2006.01)
H01L 27/22 (2006.01)

(52) U.S. Cl.
CPC ............ G11C 11/161 (2013.01); G11C 11/165 (2013.01); H01L 27/222 (2013.01); H01L 43/08 (2013.01)

(58) Field of Classification Search
CPC .. G11C 11/155; H01L 27/222; H01L 27/224; H01L 27/226; H01L 27/228; H01L 43/02
See application file for complete search history.

(56) References Cited

U.S. PATENT DOCUMENTS

| | | | | |
|---|---|---|---|---|
| 5,936,293 A * | 8/1999 | Parkin | ............... | B82Y 25/00 257/421 |
| 6,768,152 B2 * | 7/2004 | Higo | ............... | B82Y 10/00 257/294 |
| 7,432,574 B2 * | 10/2008 | Nakamura | ............ | B82Y 25/00 257/288 |
| 7,935,435 B2 * | 5/2011 | Gao | ............... | B82Y 25/00 257/421 |
| 8,154,957 B1 * | 4/2012 | Katsnelson | ............ | G11B 5/02 365/122 |
| 8,164,864 B2 * | 4/2012 | Kaiser | ............ | B82Y 25/00 360/324.2 |
| 8,310,868 B2 * | 11/2012 | Kramer | ............ | H01L 27/228 257/295 |
| 8,553,451 B2 * | 10/2013 | Liu | ............... | G11C 11/16 365/130 |

(Continued)

FOREIGN PATENT DOCUMENTS

| KR | 10-2013-0056327 A | 5/2013 |
|---|---|---|
| KR | 10-2014-0142929 A | 12/2014 |
| KR | 10-2015-0012511 A | 2/2015 |

OTHER PUBLICATIONS

Guo et al., 'Resistive Computation: Avoiding the Power Wall with Low-Leakage, STT-MRAM Based Computing', ISCA '10, Jun. 19-23, 2010, Saint-Malo, France, pp. 371-382 [online]: University of Rochester [retrieved on Sep. 4, 2015]. Retrieved from: http://www.cs.rochester.edu/~ipek/isca10.pdf.*

(Continued)

Primary Examiner — Harry W Byrne
Assistant Examiner — Lance Reidlinger
(74) Attorney, Agent, or Firm — Perkins Coie LLP

(57) ABSTRACT

An electronic device includes semiconductor memory, and the semiconductor memory includes a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer.

20 Claims, 12 Drawing Sheets

(56) References Cited

U.S. PATENT DOCUMENTS

| | | | | |
|---|---|---|---|---|
| 8,994,131 B2* | 3/2015 | Shimomura | ......... | G11C 11/161 257/421 |
| 2015/0052302 A1* | 2/2015 | Dong | ...................... | H01L 27/22 711/118 |

OTHER PUBLICATIONS

Alabaster, Jay, 'Toshiba develops MRAM for smartphone processors', Computerworld, Dec. 10, 2012, [online]: www.computerworld.com [retrieved on Sep. 4, 2015]. Retrieved from: http://www.computerworld.com/article/2493606/computer-processors/toshiba-develops-mram-for-smartphone-processors.html.*

Hardware Overview, [online]: UC Riverside [retrieved on Sep. 4, 2015]. Retrieved from: http://www.cs.ucr.edu/~gusta/cs8s05/hardware.htm.*

* cited by examiner

MRAM WITH MAGNETIC MATERIAL SURROUNDING CONTACT PLUG

CROSS-REFERENCE TO RELATED APPLICATION

This patent document claims priority of Korean Patent Application No. 10-2014-0028754, entitled "ELECTRONIC DEVICE AND METHOD FOR FABRICATING THE SAME" and filed on Mar. 12, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device facilitates fabricating processes and can improve characteristics of a variable resistance element and a method of fabricating the same.

In one aspect, an electronic device is provided to include semiconductor memory that includes a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has the same magnetization direction as the second magnetic layer. The vertical direction is substantially perpendicular to the top surface of the substrate.

Implementations of the above aspect may include one or more the following.

In some implementations, the magnetization directions of the first magnetic layer, the second magnetic layer and the third magnetic layer are parallel to the vertical direction. In some implementations, along a vertical axis penetrating through the variable resistance element and the contact plug, a direction of a magnetic field generated by the third magnetic layer is opposite to that generated by the second magnetic layer. In some implementations, the third magnetic layer offset an influence of a magnetic field generated by the second magnetic layer. In some implementations, a width of the variable resistance element is smaller than a width of an outer circumference of the third magnetic layer in a horizontal direction which is parallel to a surface of the substrate. In some implementations, a top surface of the third magnetic layer is positioned at a level same as or lower than a top surface of the contact plug in the vertical direction. In some implementations, a bottom surface of the third magnetic layer is positioned at a level higher than a bottom surface of the contact plug in the vertical direction. In some implementations, a width of the variable resistance element is same as or similar to a width of the contact plug in a horizontal direction which is parallel to a surface of the substrate. In some implementations, the variable resistance element includes a plurality of variable resistance elements, the contact plug includes a plurality of contact plugs, wherein each of the plurality of contact plugs is coupled to each of the plurality of variable resistance elements, and the third magnetic layer includes a plurality of third magnetic layers, wherein each of the plurality of third magnetic layers surrounds a sidewall of each of the plurality of contact plugs. In some implementations, the variable resistance element includes a plurality of variable resistance elements, the contact plug includes a plurality of contact plugs, wherein each of the plurality of contact plugs is coupled to each of the plurality of variable resistance elements, and the third magnetic layer surrounds sidewalls of the plurality of contact plugs. In some implementations, the semiconductor memory further includes: an additional contact plug; and an additional variable resistance element which is coupled to the additional contact plug, and wherein the additional contact plug is adjacent to the third magnetic layer. In some implementations, a sidewall of the additional contact plug is not surrounded by a magnetic material. In some implementations, a magnetic field generated by the third magnetic layer influences on both the variable resistance element and the additional variable resistance element.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method of manufacturing an electronic device comprising semiconductor memory is provided. The method includes: forming an interlayer dielectric layer over a substrate; forming a third magnetic layer which has a same magnetization direction as a second magnetic layer, over the interlayer dielectric layer or in the interlayer dielectric layer; forming a contact plug which penetrates through the third magnetic layer and the interlayer dielectric layer to be coupled to a portion of the substrate, wherein a sidewall of the contact plug is surrounded by the third magnetic layer; and forming a variable resistance element which is coupled to the contact plug over the contact plug and includes a first magnetic layer having a variable magnetization direction, the second magnetic layer having a pinned magnetization direction, and a tunnel barrier layer interposed between the first magnetic layer and the second magnetic layer. In another aspect, a method is provided for manufacturing an electronic device comprising semiconductor memory. The method may include forming an interlayer dielectric layer over a substrate; forming a bias magnetic layer over or in at least a portion of the interlayer dielectric layer, wherein the bias magnetic layer has a bias magnetization; forming a contact plug over the substrate which penetrates through the third magnetic layer and the interlayer dielectric layer to be coupled to a portion of the substrate, wherein a sidewall of the contact plug is surrounded by the third magnetic layer; and forming a variable resistance element over the contact plug and coupled to the contact plug to include a first magnetic layer having a variable magnetization direction, the second magnetic layer having a pinned magnetization direction, and a tunnel barrier layer interposed between the first magnetic layer and the second magnetic layer, wherein, in the first magnetic layer, the pinned magnetization direction is opposite to a bias magnetic field direction produced by the bias magnetic layer.

Implementations of the above aspects in connection with the methods may include one or more the following.

In some implementations, the forming of the third magnetic layer includes forming a third magnetic material over an entire surface of the interlayer dielectric layer. In some implementations, the bias magnetic layer is formed over an entire surface of the interlayer dielectric layer except for an area occupied by the contact plug. In some implementations, the forming of the contact plug includes forming a plurality of contact plugs penetrating through the third magnetic material. In some implementations, the forming of the third magnetic layer includes: forming a trench which overlaps with the contact plug and has a lager width than the contact plug in a plan view, by selectively etching a portion of the interlayer dielectric layer; and forming a third magnetic material filled in the trench. In some implementations, the forming of the third magnetic layer includes: forming a trench in a region in which the contact plug is to be formed by selectively etching the region; and forming a third magnetic material filled in the trench. In some implementations, the contact plug includes a plurality of contact plugs, and the trench overlaps with each of the plurality of contact plugs.

In another aspect, an electronic device is provided to include semiconductor memory that includes a substrate; an interlayer dielectric layer over the substrate; contact plugs formed in the interlayer dielectric layer over the substrate, each contact plug being electrically conductive; magnetic regions formed in the interlayer dielectric layer and respectively formed to surround the contact plugs so that each contact plug is surrounded by a corresponding magnetic region; and variable resistance elements respectively formed over the contact plugs, each variable resistance element being in electrical contact with a corresponding contact plug, and each variable resistance element including a first magnetic layer having a variable magnetization direction, a second magnetic layer having a pinned magnetization direction, and a tunnel barrier layer interposed between the first magnetic layer and the second magnetic layer, wherein the magnetic regions and the variable resistance elements are structured so that each magnetic region surrounding a corresponding contact plug has a magnetization direction to produce a magnetic field in a direction opposite to a direction of another magnetic field produced by the second magnetic layer of the corresponding variable resistance element along a vertical axis penetrating through the corresponding contact plug and the corresponding variable resistance element.

Implementations of the above method may include one or more the following.

In some implementations, the magnetization of the first magnetic layer is perpendicular to the first magnetic layer; and the magnetization of the second magnetic layer is perpendicular to the first magnetic layer. In some implementations, each magnetic region surrounds an uppermost part of a corresponding contact plug.

These and other aspects, implementations and associated advantages are described in greater detail in the drawings, the description and the claims.

DETAILED DESCRIPTION

Figure 1A:
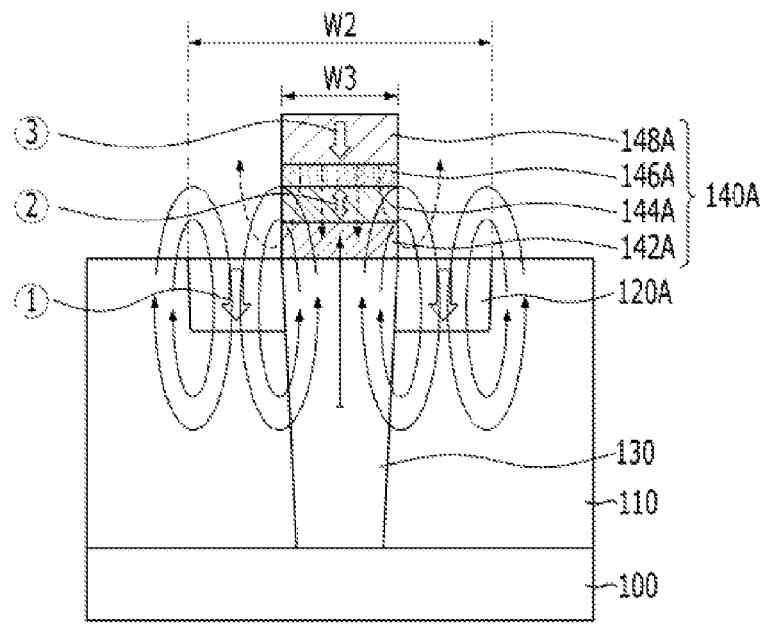
FIGS. 1A and 1B are a cross-sectional view and a plan view illustrating a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
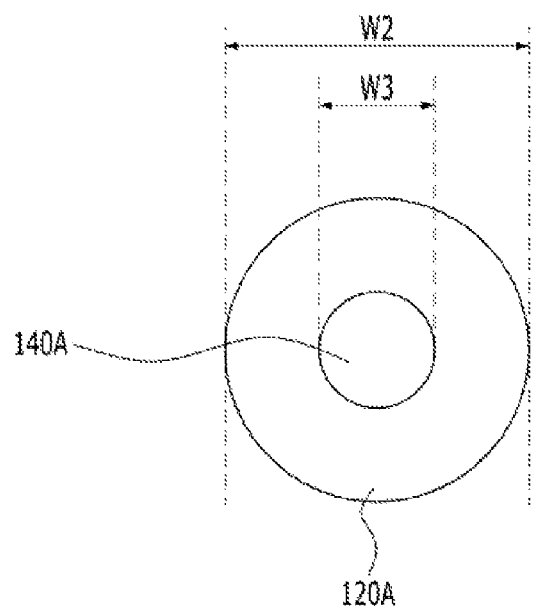

FIGS. 1A and 1B are a cross-sectional view and a plan view illustrating a semiconductor device in accordance with an implementation. The device includes a variable resistance element 140A of a multilayer structure over the substrate 100 to include a first magnetic layer 144A having a variable magnetization direction, a second magnetic layer 148A having a pinned magnetization direction, and a tunnel barrier layer 146A interposed between the first magnetic layer 144A and the second magnetic layer 148A. In addition to the first and second magnetic layers 144A and 148A, the device also includes a third magnetic layer 120A. In particular, FIG. 1B shows a top view of the device illustrating the third magnetic layer 120A and the variable resistance element 140A of FIG. 1A.

Referring to FIGS. 1A and 1B, the semiconductor device may include a substrate 100, an interlayer dielectric layer 110 disposed over the substrate 100, a contact plug 130 penetrating through the interlayer dielectric layer 110 to be coupled to a portion of the substrate 100, the variable resistance element 140A disposed over the contact plug 130 and coupled to the contact plug 130, and the third magnetic layer 120A formed in the interlayer dielectric layer 110 and surrounding a sidewall of the contact plug 130.

The substrate 100 may be a structure including various elements, conductive lines, insulating materials, etc. For example, the substrate 100 may include a switching element (not shown) that is coupled to an end of the variable resistance element 140A through the contact plug 130 and controls the supply of a current or voltage to the variable resistance element 140A. The switching element may include a transistor or a diode, etc. One end of the switching element may be coupled to the contact plug 130, and the other end of the switching element may be coupled to a line (now shown), for example, a source line.

The interlayer dielectric layer 110 may include various insulating materials, such as a silicon oxide, etc.

The contact plug 130 may electrically connect the variable resistance element 140A with a portion of the substrate 100, for example, the switching element. The contact plug 130 may include various electrically conductive materials. In particular, the contact plug 130 may include a conductive material which has an excellent gap filling property and a high electrical conductivity, for example, a metal such as W, Ta, a metal nitride such as TiN, or a combination thereof. The contact plug 130 may have a pillar-shape and extend in a vertical direction which is perpendicular to a surface of the substrate 100.

As shown in FIG. 1A, the magnetization directions of the first and second magnetic layers 144A and 148A may be substantially perpendicular to surfaces of the layers or parallel to the vertical direction. Specifically, the magnetization direction of the first magnetic layer 144A is represented by an arrow ②, and the magnetization direction of the second magnetic layer 148A is represented by an arrow ③. In the present implementation as shown in FIG. 1A, the second magnetic layer 148A may have a pinned downward magnetization direction from top to bottom. It is also possible that the second magnetic layer 148A may have a pinned upward magnetization direction from bottom to top.

In the present implementation, the first magnetic layer 144A, the tunnel barrier layer 146A and the second magnetic layer 148A may be sequentially stacked over the substrate 100 so that the first magnetic layer 144A with the variable perpendicular magnetization direction is underneath the pinned second magnetic layer 148A and above the substrate 100. However, in another implementation, the second magnetic layer 148A, the tunnel barrier layer 146A and the first magnetic layer 144A may be sequentially stacked over the substrate 100 so that the first magnetic layer 144A with the variable perpendicular magnetization direction is above the pinned second magnetic layer 148A. That is, positions of the first magnetic layer 144A and second magnetic layer 148A may be reversed.

The first magnetic layer 144A and the second magnetic layer 148A may include a ferromagnetic material. The ferromagnetic material may include an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. The magnetization direction of the first magnetic layer 144A is changeable. Thus, the first magnetic layer 144A may store data depending on the magnetization direction thereof and the first magnetic layer 144A may be referred to as a free layer or a storage layer, etc. Also, since the magnetization direction of the second magnetic layer 148A is fixed, the second magnetic layer 148A may be compared with the first magnetic layer 144A and may be referred to as a pinned layer or a reference layer.

The tunnel barrier layer 146A may cause the change in the magnetization direction of the first magnetic layer 144A by tunneling of spin-polarized electrons, e.g., in form of a current flowing through the layers of the variable resistance element 140A. The tunnel barrier layer 13C may include an insulating oxide such as MgO, CaO, SrO, TiO, VO, or NbO, etc.

The variable resistance element 140A may be operated to store data as described below. When a current or voltage is supplied through the contact plug 130 coupled to a bottom end of the variable resistance element 140A and another contact plug (not shown) coupled to a top end of the variable resistance element 140A, the magnetization direction of the first magnetic layer 144A may change so that the magnetization directions of the first magnetic layer 144A and the second magnetic layer 148A become parallel or anti-parallel to each other. For example, when the magnetization directions are parallel to each other, the variable resistance element 140A may exhibit a low resistance state and store data "0", and, when the magnetization directions are anti-parallel to each other, the variable resistance element 140A may exhibit a high resistance state and store data "1".

Furthermore, the variable resistance element 140A may include additional layers. The additional layers may be used, for example, for improving a characteristic of the variable resistance element 140A and/or facilitating processes together with the first magnetic layer 144A, the tunnel barrier layer 146A and the second magnetic layer 148A. For example, the variable resistance element 140A may further include an under layer 142A interposed between the first magnetic layer 144A and the contact plug 130. The under layer 142A may include various conductive materials and perform various functions as needed. For example, the under layer 142A may increase adhesion between the contact plug 130 and a layer disposed over the under layer 142A, for example, the first magnetic layer 144A. Further, the under layer 142A may improve a device quality such as crystallinity, roughness, etc. of the layer disposed over the under layer 142A. The under layer 142A can include one or more layers interposed between the contact plug 130 and a stacked structure of the first magnetic layer 144A, the tunnel barrier layer 146A and the second magnetic layer 148A. In the present implementation, the under layer 142A may be patterned together with the stacked structure of the first magnetic layer 144A, the tunnel barrier layer 146A and the second magnetic layer 148A. By doing so, a sidewall of the under layer 142A is aligned with a sidewall of the stacked structure. However, other implementations are also possible for the under layer 142A. For example, at least a part of the under layer 142A may be buried in the interlayer dielectric layer 110 while being deposited over the contact plug 130. Although not shown, the variable resistance element 140A may further include an upper layer which is disposed over the second magnetic layer 148A to perform various functions.

The variable resistance element 140A and the contact plug 130 may overlap with each other along the vertical direction. There may be an axis penetrating through the variable resistance element 140A and the contact plug 130 in the vertical direction. In a horizontal direction which is parallel to the surface of the substrate 100, a width W3 of the variable resistance element 140A may be the same as or similar to a width of the contact plug 130. In the present implementation, the width W3 of the variable resistance element 140A is the same as a width of a top surface of the contact plug 130. In another implementation, the width W3 of the variable resistance element 140A may be slightly larger or slightly smaller than the width of the top surface of the contact plug 130.

Since the second magnetic layer 148A serves as a pinned layer having a fixed magnetization direction, a strong magnetic field is generated by the second magnetic layer 148A and is represented by a dotted arrow. Under the influence of this magnetic field, a bias magnetic field in the first magnetic layer 144A may be generated. This is described in more detail with reference to FIG. 5

Figure 5:
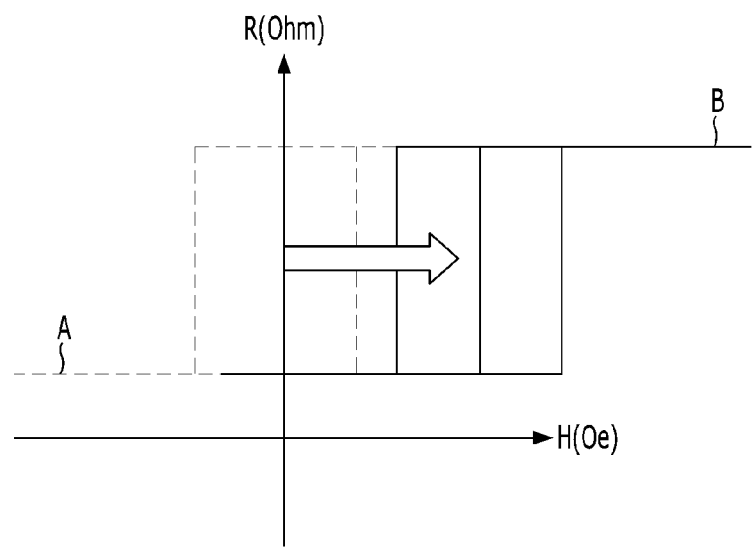
FIG. 5 is a view showing a magnetization curve of the first magnetic layer.

FIG. 5 shows a magnetization curve of the first magnetic layer 144A. A dotted line A of FIG. 5 shows a case that a bias magnetic field does not exist in the first magnetic layer 144A, and a solid line B of FIG. 5 shows a case that a bias magnetic field exists in the first magnetic layer 144A.

Referring to the line A of FIG. 5, when the bias magnetic field does not exist in the first magnetic layer 144A, the magnetization curve is symmetric with respect to a magnetization axis. Therefore, a switching of the resistance state in the variable resistance element 140A from the low resistant state to the high resistant state or vice versa may occur symmetrically.

On the other hand, referring to line B of FIG. 5, when the magnetization curve shifts to a side, for example, a right side (see the arrow) by the bias magnetic field in the first magnetic layer 144A. In this case, the magnetization curve is no longer symmetric with respect to the magnetization axis. Therefore, an unsymmetrical switching may occur, thereby deteriorating a switching characteristic of the variable resistance element.

In order to solve the above problem, the third magnetic layer 120A is provided.

Referring back to FIGS. 1A and 1B, the third magnetic layer 120A may be formed to surround a sidewall of the contact plug 130. The third magnetic layer 120A may have a shape like a ring surrounding the contact plug 130. A width W2 of an outer circumference of the third magnetic layer 120A may be greater than the width W3 of the variable resistance element 140A in the horizontal direction. The third magnetic layer 120A may include various ferromagnetic materials and have the same magnetization direction as the second magnetic layer 148A (see arrow ①). A magnetic field generated by the third magnetic layer 120A is represented by a solid arrow in FIG. 1A.

The third magnetic layer 120A which surrounds the sidewall of the contact plug 130 is positioned at an outside of the variable resistance element 140A as shown in FIG. 1B. As represented by the solid arrow in FIG. 1A, the third magnetic layer 120A has the same magnetization direction as the second magnetic layer 148A, In this case, a direction of the magnetic field generated by the third magnetic layer 120A is opposite to the magnetization direction of the third magnetic layer 120A along a vertical axis penetrating through the variable resistance element 140A and the contact plug 130. For example, the magnetic field by the third magnetic layer 120A has the upward direction along the vertical axis. Meanwhile, a direction of a magnetic field generated by the second magnetic layer 148A may be the same as the magnetization direction of the second magnetic layer 148A along the vertical axis. For example, the magnetic field generated by the second magnetic layer 148A has the downward direction along the vertical axis. Therefore, the third magnetic layer 120A may offset the influence of the magnetic field generated by the second magnetic layer 148A. As the influence on the first magnetic layer 144A that is caused by the magnetic field of the second magnetic layer 148A is reduced, the effect of a bias magnetic field in the first magnetic layer 144A may be reduced or removed. Therefore, a switching characteristic of the variable resistance element 140A can be improved.

In the present implementation, the third magnetic layer 120A may be formed to surround a sidewall of a portion of the contact plug 130. For example, an uppermost part of the contact plug 130 may be surrounded by the third magnetic layer 120A. In this case, the top surface of the third magnetic layer 120A may be positioned at the same level as that of the contact plug 130, while the bottom surface of the third magnetic layer 120A may be positioned above the bottom surface of the contact plug 130. However, other implementations are also possible on the position of the third magnetic layer 120A with regard to the contact plug 130. For example, as long as the top surface of the third magnetic layer 120A is positioned at the same as or lower than that of the contact plug 130, the height and/or the thickness of the third magnetic layer 120A may be appropriately controlled depending on fabricating processes. In the illustrated example, the third magnetic layer 120A contacts the sidewall of the uppermost part of the contact plug 130 so that the third magnetic layer 120A can effectively offset, or can produce a maximized offset against, the influence of the magnetic field by the second magnetic layer.

FIGS. 2A to 2D are cross-sectional views illustrating an example of a fabricating method of the semiconductor device of FIGS. 1A and 1B.

Figure 2A:
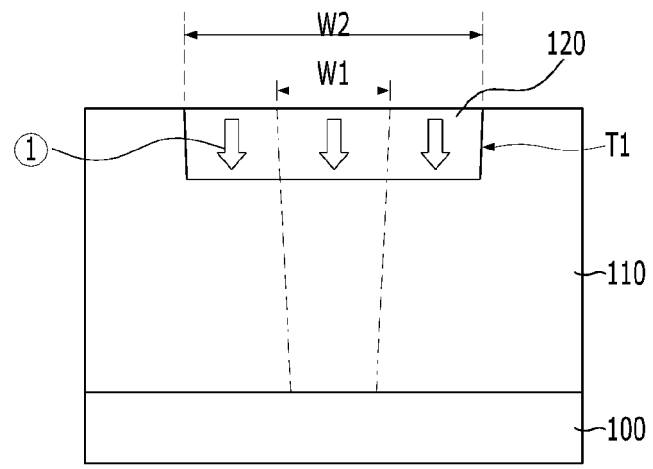
FIGS. 2A to 2D are cross-sectional views illustrating an example of a fabricating method of the semiconductor device of FIGS. 1A and 1B.

Referring to FIG. 2A, an interlayer dielectric layer 110 may be formed by depositing an insulating material over a substrate 100

A first trench T1 may be formed in the interlayer dielectric layer 110 by selectively etching a portion of the interlayer dielectric layer 110. Then, a third magnetic material 120 may be formed to be filled in the first trench T1.

From the plan view, the region of the first trench T1 may overlap with the region where a third magnetic layer and a contact plug are to be formed. From the vertical view, the first trench T1 has a depth corresponding to the thickness of the third magnetic layer. In FIG. 2A, the region where the contact plug is to be formed is represented by a dotted line, and the width of the top surface of the contact plug is represented by W1. Further, referring to FIG. 2A, the region where the third magnetic layer is to be formed has the inner circumference having the width of W1, and the outer circumference having the width of W2.

The third magnetic material 120, which is used for forming the third magnetic layer, may be formed to have a fixed magnetization direction. For example, the third magnetic material 120 may have a downward magnetization direction (see arrow ①). The third magnetic material 120 may be formed by depositing a ferromagnetic material over the resultant structure where the first trench T1 is formed and performing a planarization process, for example, a CMP (Chemical Mechanical Polishing) or an etch-back until the interlayer dielectric layer 110 is exposed.

Figure 2B:
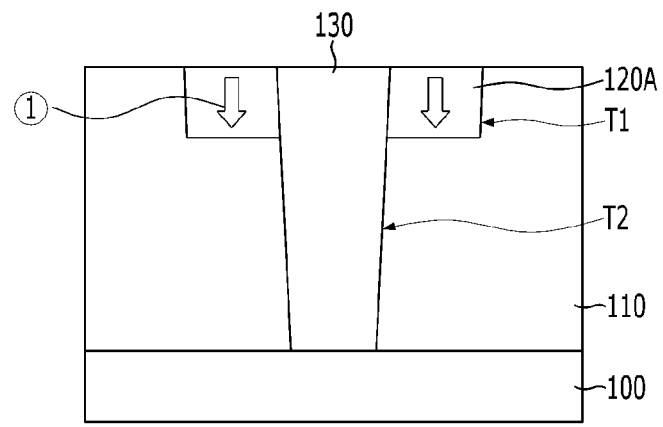

Referring to FIG. 2B, a second trench T2 may be formed by selectively etching portions of the third magnetic material 120 and the interlayer dielectric layer 110. The contact plug 130 may be formed in the etched portion. The contact plug 130 may be formed by filling the second trench T2 with a conductive material. While filling the second trench T2 with the conductive material to form the contact plug 130, the central portion of the third magnetic material 120 may be removed to form a ring shape 120A surrounding a sidewall of the contact plug 130.

Figure 2C:
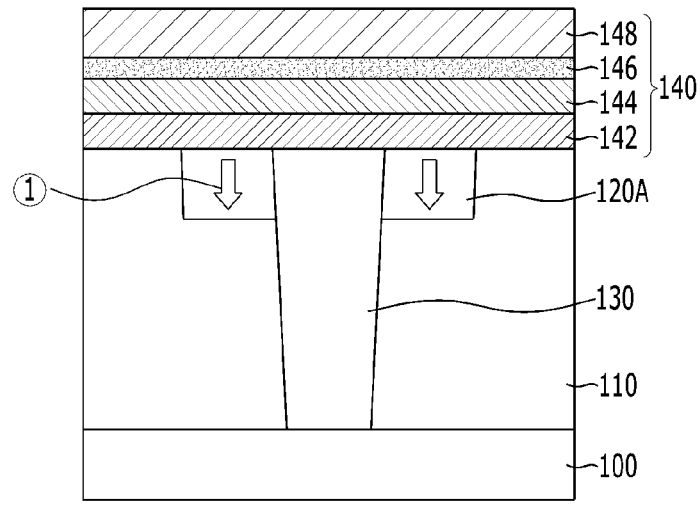

Referring to FIG. 2C, layers for forming a variable resistance element are stacked over the resultant structure of FIG. 2B. For example, a stacked structure 140 includes an under material 142, a first magnetic material 144, a tunnel barrier material 146 and a second magnetic material 148 that are sequentially stacked. A depositing order of the first magnetic material 144 and the second magnetic material 148 may be reversed. Further, other material layer (not shown) may be added to form the variable resistance element.

Figure 2D:
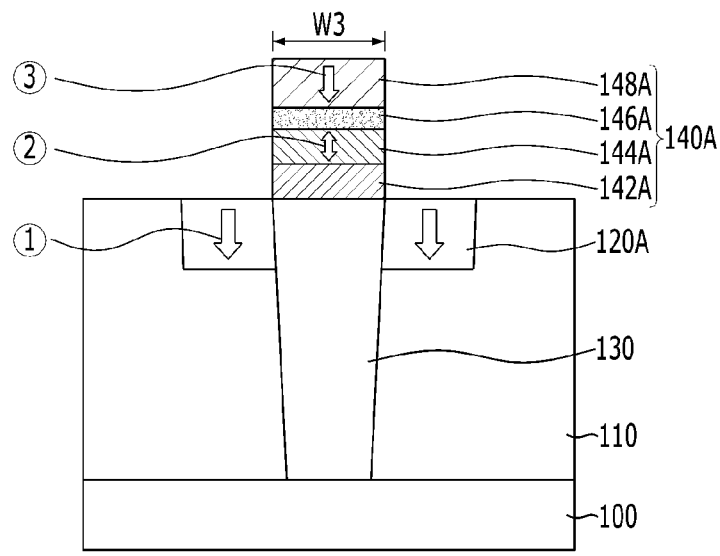

Referring to FIG. 2D, a variable resistance element 140A may be formed by selectively etching the stacked structure 140. The variable resistance element 140A is positioned over the contact plug 130 and coupled to the contact plug 130. The variable resistance element 140A may include an under layer 142A, a first magnetic layer 144A, a tunnel barrier layer 146A and a second magnetic layer 148A.

The above implementations may be used to achieve one or more following advantages.

First, the influence of the magnetic field generated by the second magnetic layer 148A may be reduced or removed by using the third magnetic layer 120A. Thus, a symmetrical switching may be possible, which improves a switching characteristic of the variable resistance element 140A.

Also, the third magnetic layer 120A is buried in the interlayer dielectric layer 110, an etching thickness during of the stacked structure 140 may be reduced. Thus, an etching process can be facilitated or simplified. In the conventional prior art, a layer used to offset an influence of a magnetic field caused by a pinned layer is formed as a part of a variable resistance element. Such the layer is etched together with other layers used for forming the variable resistance element, which makes an etching process difficult. However, in the present implementation, by burying the third magnetic layer 120A in the interlayer dielectric layer 110, the difficulty of the etching process that exists in the prior art can be solved.

Meanwhile, in the above implementations, the third magnetic layer 120A surrounding at least a part of the contact plug 130 has an island-shape and thus is separated from other elements. However, other implementations are also possible regarding the shape of the third magnetic layer 120A as long as the third magnetic layer 120A surrounds the sidewall of at least a part of the contact plug 130. Furthermore, the third magnetic layer 120A may have a plate-shape to cover a whole substrate 100. This will be described with reference to FIGS. 3A and 3B.

Figure 3A:
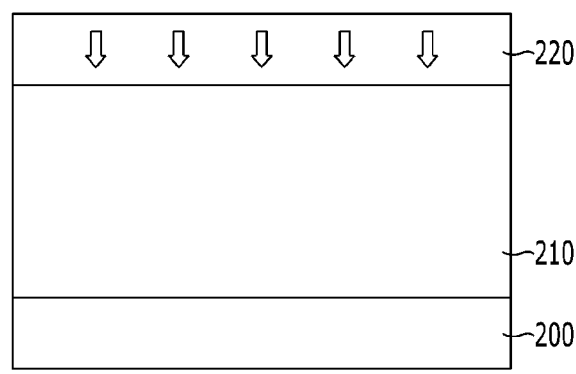
FIGS. 3A and 3B are cross-sectional views illustrating a semiconductor device and an example of a method for fabricating the same in accordance with another implementation.
Figure 3B:
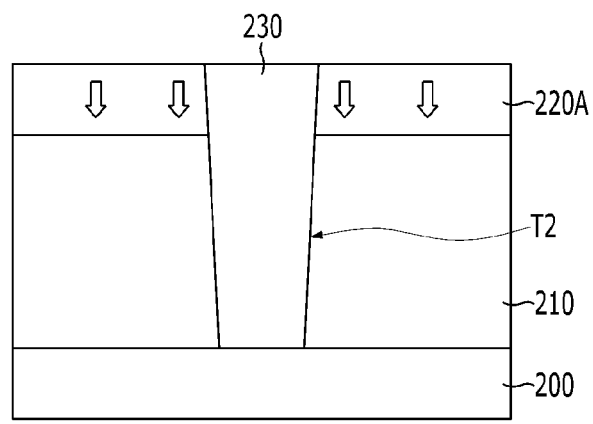

FIGS. 3A and 3B are cross-sectional views illustrating a semiconductor device and an example of a method for fabricating the same in accordance with another implementation. Detailed descriptions for elements which are substantially same as those in the above implementations will be omitted.

Referring to FIG. 3A, an interlayer dielectric layer 210 may be formed by depositing an insulating material over a substrate 200. Then, a third magnetic material 220 may be formed over an entire surface of the interlayer dielectric layer 210. The third magnetic material 220 may include the substantially same material and have the substantially same thickness as the third magnetic layer 120 of the above-described implementation.

Referring to FIG. 3B, a second trench T2 may be formed by selectively etching portions of the third magnetic material 220 and the interlayer dielectric layer 210. The etched portions may be used for forming a contact plug 230. The contact plug 230 may be formed by filling the second trench T2 with a conductive material. While forming of the contact plug 230, a portion of the third magnetic material 220 may be removed to have a shape to surround a sidewall of a portion of the contact plug 230. The third magnetic material 220 remained after its portion is removed is referred to as the third magnetic layer 220A.

Subsequent processes including processes for forming a variable resistance element which is coupled to the contact plug 230 may be substantially same as the above-described implementation.

Differently from the aforementioned implementation, in the present implementation, the third magnetic layer 220A has a plate-shape to cover the substrate 100 except for a region where the contact plug 230 is formed. Since a process for forming the first trench T1 is not necessary in the present implementation, a fabricating process can be simplified.

Multiple contact plugs and variable resistance elements coupled thereto may be provided. The contact plugs and the variable resistance elements may be arrayed in various manners to form a cell array. For example, in implementations of FIGS. 1A to 2D, an one-to-one relationship is applied between the third magnetic layer and the contact plug. Alternately, in other implementations of FIGS. 3A and 3B, one-to-many relationship may be applied between the third magnetic layer and the contact plug. This is described in more detail with reference to FIGS. 4A and 4B.

Figure 4A:
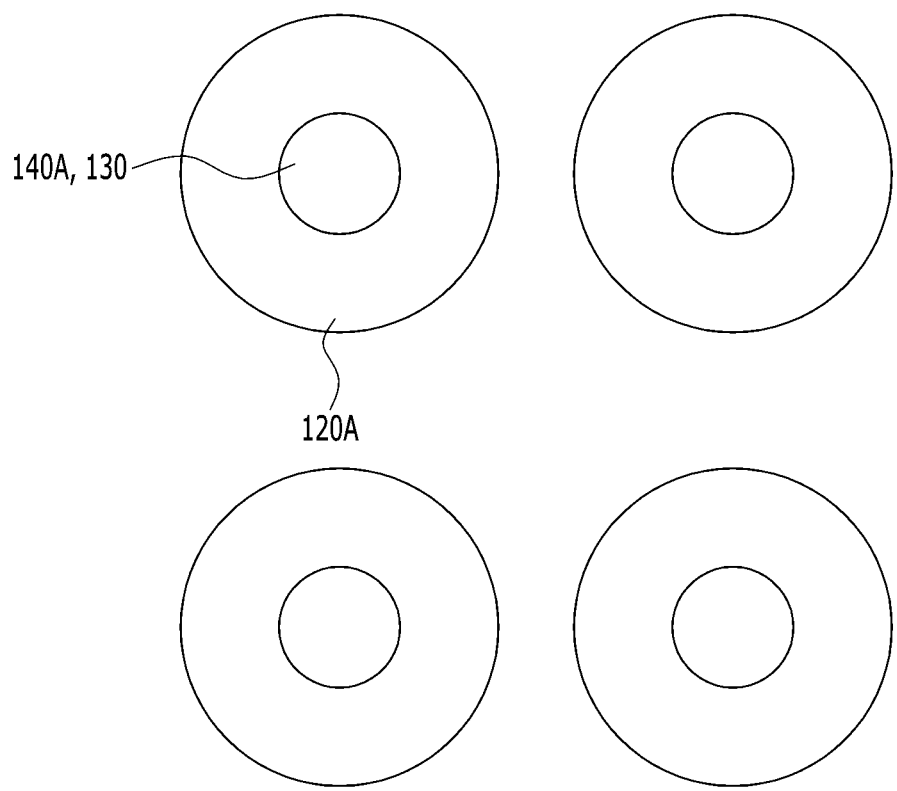
FIGS. 4A and 4B are plan views illustrating a semiconductor device in accordance with another implementation.

Referring to FIG. 4A, multiple pairs of a contact plug 130 and a variable resistance element 140A are provided along various directions, for example, in a matrix form. The variable resistance elements 140A may be coupled to contact plugs 130, respectively.

A plurality of third magnetic layers 120A may be provided to respectively surround the plurality of contact plugs 130. Each of the third magnetic layers 120A may have an island shape. Thus, the third magnetic layers 120A may be separated from each other.

Figure 4B:
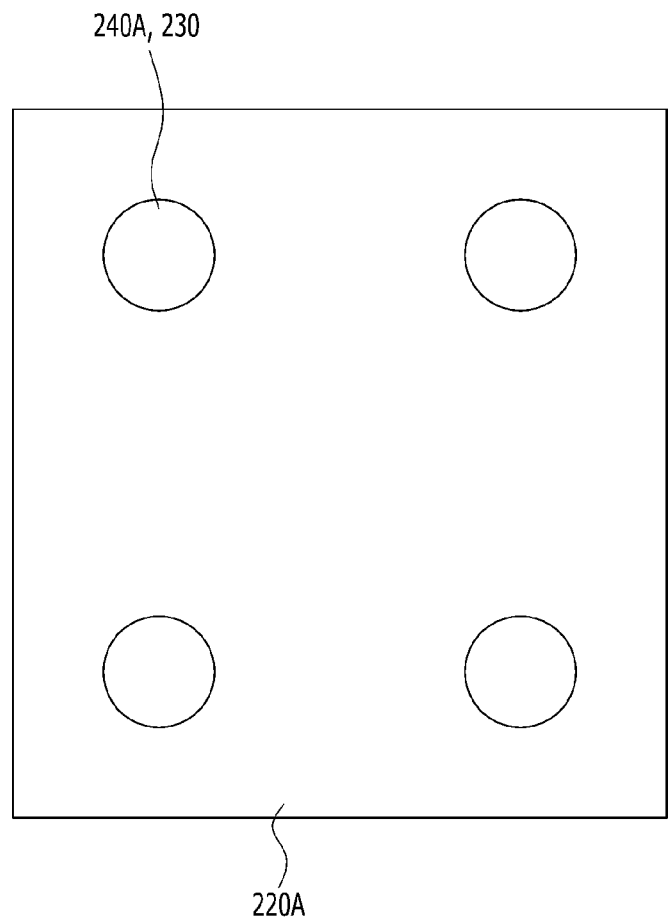

Referring to FIG. 4B, contact plugs 230 and variable resistance elements 240A may be provided along various directions, for example, in a matrix form. The variable resistance elements 240A may be coupled to contact plugs 230, respectively.

In FIG. 4B, a single third magnetic layer 220A may surround the plurality of contact plus 230. For this, the third magnetic layer 220A may have a plate-shape to cover a whole of the substrate 100 except for a region where the contact plug 230 is formed. The direction of the magnetic field generated by the third magnetic layer 220A is opposite to that caused by the pinned layer along the vertical axis penetrating through the contact plug 230 and the variable resistance element 240A. Thus, a switching characteristic of the variable resistance element 240A may be improved like the implementation of FIG. 4A.

In the above implementations, all of contact plugs are surrounded by the third magnetic layer. In the implementation of FIG. 4A, the plurality of contact plugs 130 are surrounded by the plurality of third magnetic layers 120A, respectively. In the implementation of FIG. 4B, the plurality of contact plugs 230 are surrounded by the third magnetic layer 220A. However, other implementations are also possible in which there may exist a contact plug not surrounded by the third magnetic layer. Assuming that there are first and second contact plugs which are adjacent to each other, and that the first contact plug is surrounded by the third magnetic layer while the second contact plug is not surrounded by the third magnetic layer. In this case, since the second contact plug is adjacent to the first contact plug surrounded by the third magnetic layer, the second contact plug and the variable resistance element coupled thereto may be also influenced by the adjacent third magnetic layer surrounding the first contact plug. This will be more fully described with reference to FIGS. 6A and 6B.

Figure 6A:
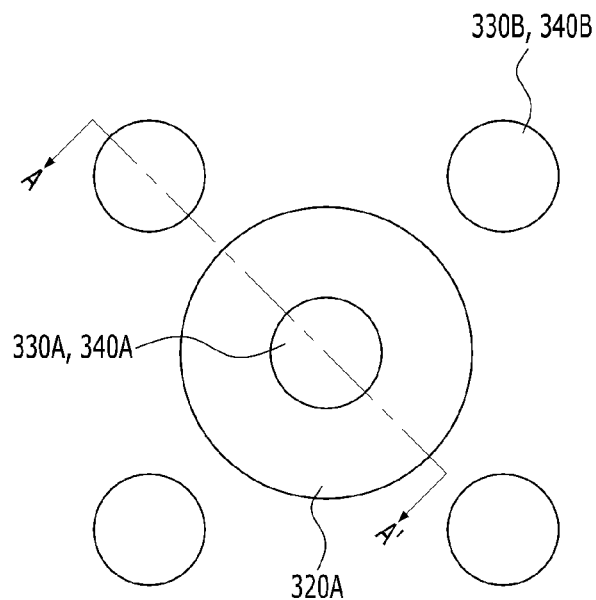
FIGS. 6A to 6C are views illustrating a semiconductor device in accordance with another implementation.
Figure 6B:
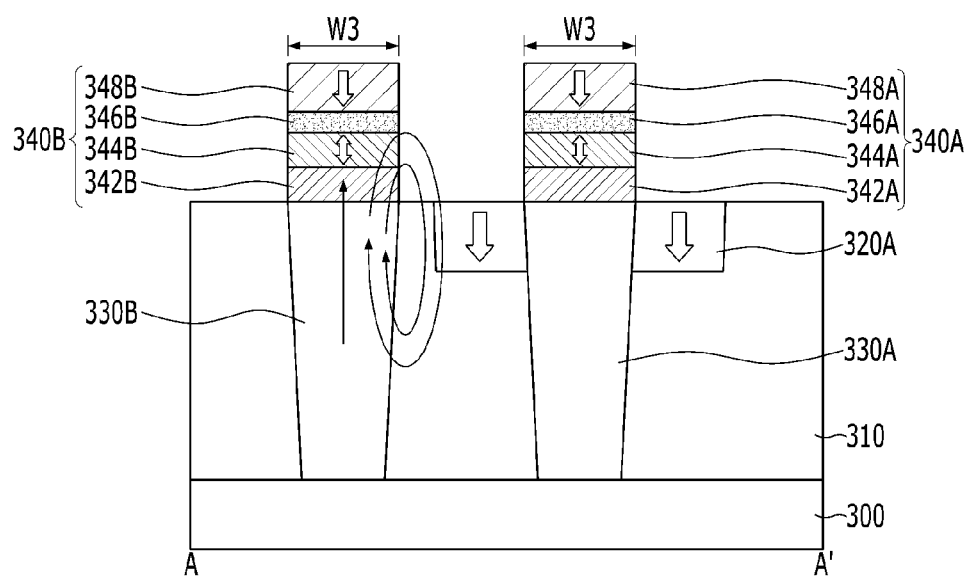
Figure 6C:
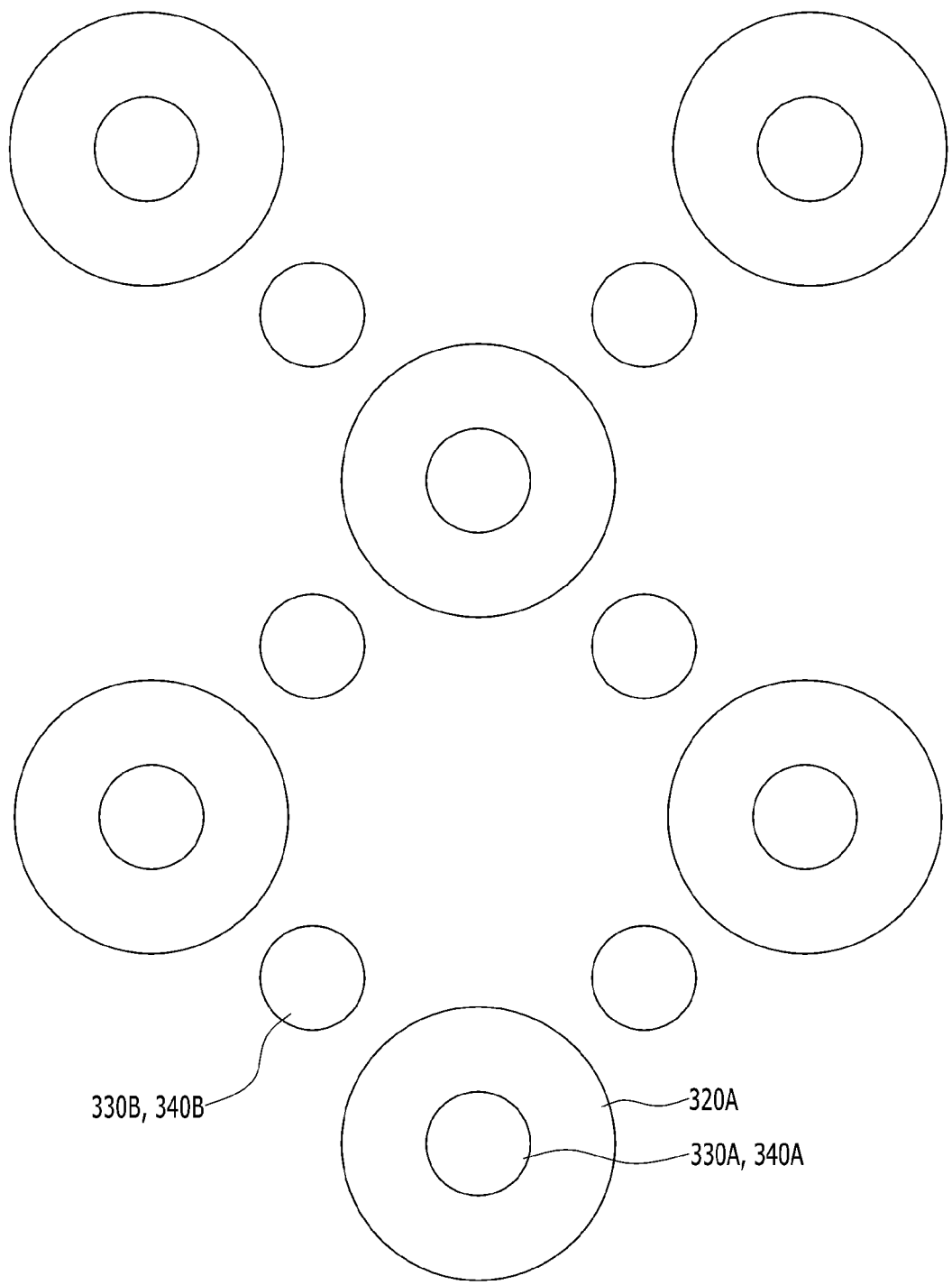

FIGS. 6A to 6C are views illustrating a semiconductor. For convenience of the descriptions, hereinafter, a contact plug which is surrounded by the third magnetic layer will be referred to as a first contact plug, and a contact plug which is not surrounded by the third magnetic layer will be referred to as a second contact plug. FIG. 6A is a plan view showing a group of first contact plugs, FIG. 6B is a cross-sectional view taken along a line A-A' of FIG. 6A, and FIG. 6C is a plan view showing a plurality groups of first contact plugs.

Referring to FIGS. 6A and 6B, a semiconductor device may include an interlayer dielectric layer 310 disposed over a substrate 300, first and second contact plugs 330A and 330B penetrating through the interlayer dielectric layer 310 to be coupled to portions of the substrate 300, first and second variable resistance elements 340A and 340B disposed over the first and second contact plugs 330A and 330B to be coupled to the first and second contact plugs 330A and 330B, respectively, and a third magnetic layer 320A formed in the interlayer dielectric layer 310 to surround a sidewall of a portion of the first contact plug 330A.

Each of the first and second variable resistance elements 340A and 340B may be substantially same as the variable resistance element 140A described above. The first and second variable resistance elements 340A and 340B may include under layers 342A and 342B, first magnetic layers 344A and 344B serving as a free layer, tunnel barrier layers 346A and 346B, and second magnetic layers 348A and 348B serving as a pinned layer.

Since a sidewall of the first contact plug 330A is surrounded by the third magnetic layer 320A, a bias magnetic field in the first variable resistance element 340A may be reduced or removed.

As shown in FIG. 6B, a sidewall of the second contact plug 330B is not surrounded by any magnetic material. However, since the second contact plug 330B is adjacent to the third magnetic layer 320A, the second variable resistance element 340B may be influenced by the third magnetic layer 320A. That is, a magnetic field generated by the third magnetic layer 320A may influence on both the first variable resistance element 340A and the second variable resistance element 340B. As a result, a bias magnetic field in the second variable resistance element 340B may be reduced or removed In FIGS. 6A and 6B, the second contact plug 330B is separated from the third magnetic layer 320A. However, other implementations are also possible. For example, a part of the sidewall of the second contact plug 330B may be in direct contact with the third magnetic layer 320A. Also, in FIGS. 6A and 6B, there are four second contact plugs 330B which are adjacent to one first contact plug 330A in a diagonal direction. However, other implementations are also possible on a number or an array of the second contact plug 330B. For example, a number or an array of the second contact plug 330B may be changed in various manners as long as the second contact plug 330B is adjacent to the first contact plug 330A.

Referring to FIG. 6C, first contact plugs 330A and second contact plugs 330B are provided in a matrix form. A plurality of first contact plugs 330A are surrounded by the plurality of third magnetic layers 320A, respectively. A plurality of second contact plugs 330B are not surrounded by any third magnetic layers. In FIG. 6C, each of the plurality of second contact plugs 330B may be disposed between two adjacent first contact plugs 330A in one direction, for example, in a diagonal direction. In this case, the second variable resistance element 340B may be influenced by two adjacent third magnetic layers 320A. Regarding a number and an arrangement of the second contact plugs 330B, other implementations are also possible. A number or an array of the first contact plugs 330A or the second contact plugs 330B may be changed in various manners.

The above and other memory circuits or semiconductor devices based on the disclosed technology can be used in a range of devices or systems. FIGS. 7-11 provide some examples of devices or systems that can implement the memory circuits disclosed herein.

Figure 7:
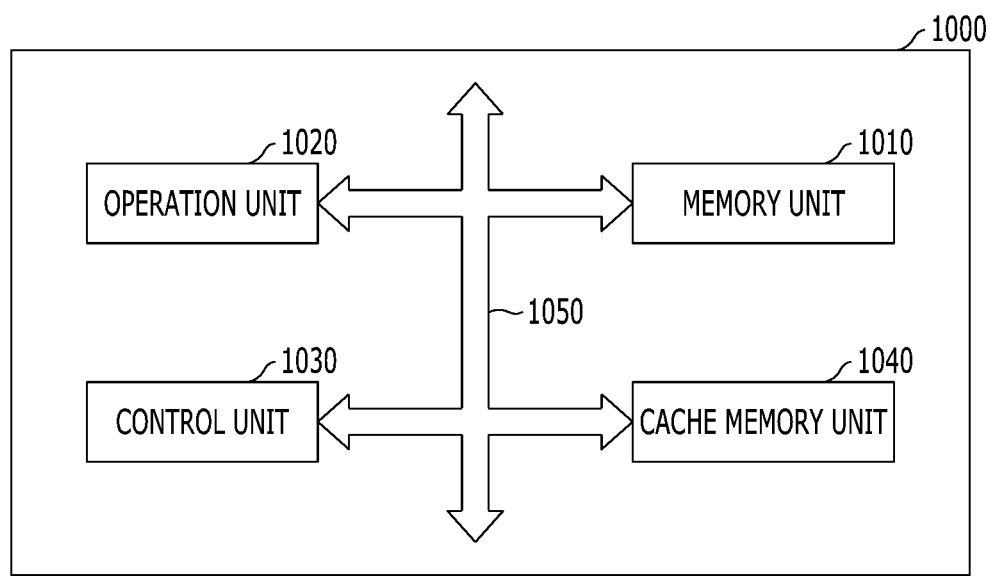
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the memory unit 1010 may become simplified and data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
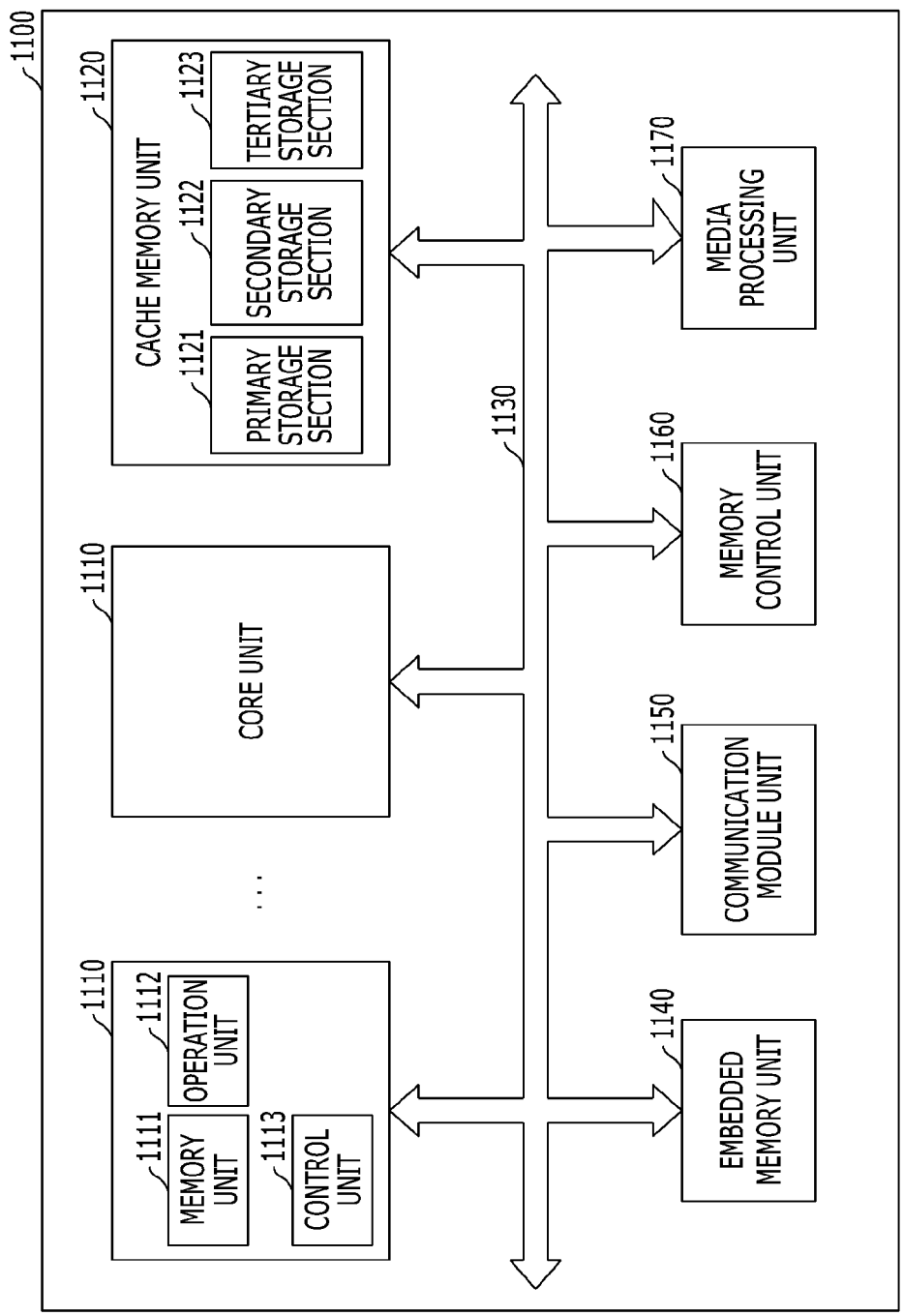
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the cache memory unit 1120 may become simplified and data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
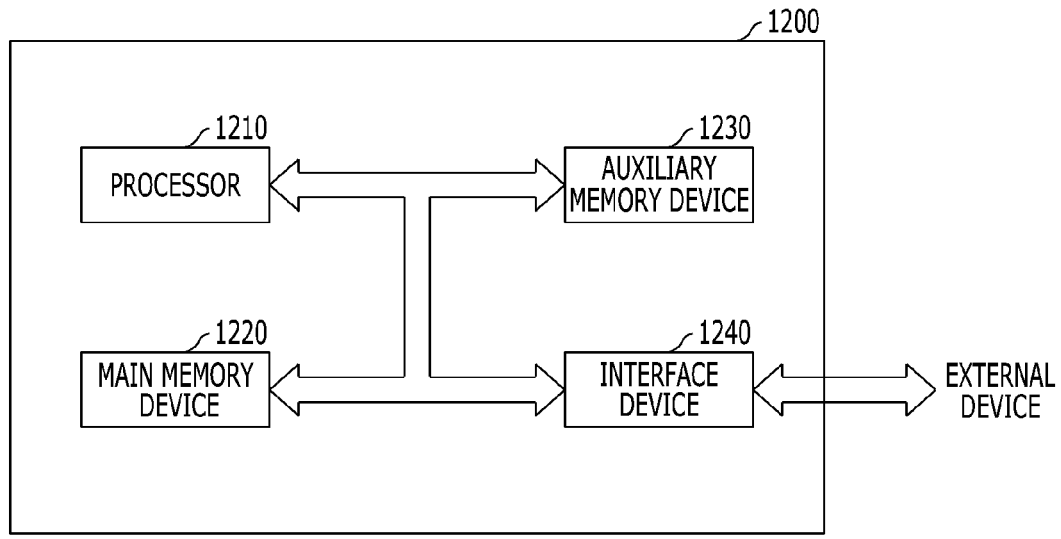
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the main memory device 1220 may become more simplified and data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the auxiliary memory device 1230 may become simplified and data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
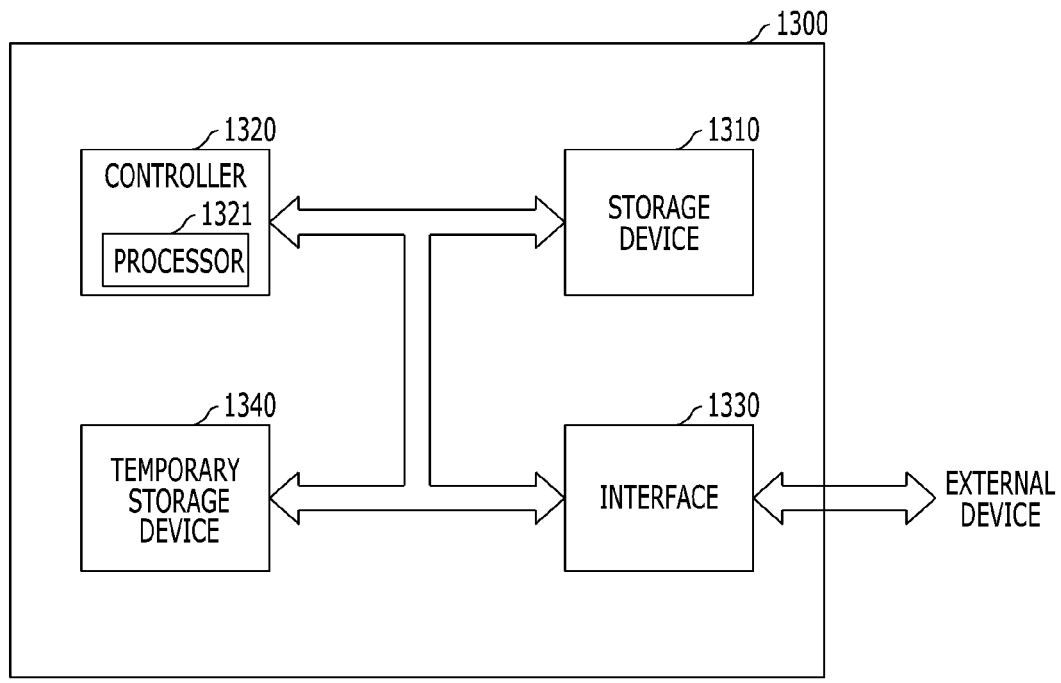
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the storage device 1310 or the temporary storage device 1340 may become more simplified and data storage characteristics of the storage device 1310 or the temporary storage device 1340 may be improved. As a consequence, operating characteristics and data storage characteristics of the data storage system 1300 may be improved.

Figure 11:
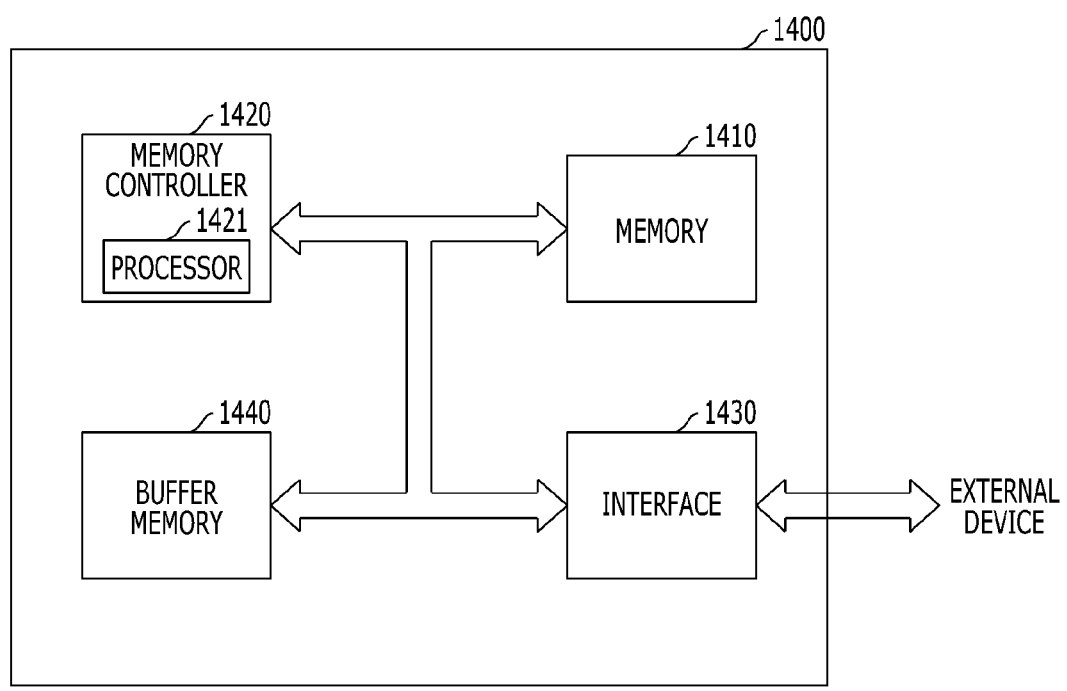
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the memory 1410 may become simplified and data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a contact plug which is disposed over a substrate and extends in a vertical direction; a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and a third magnetic layer which surrounds a sidewall of the contact plug and has a same magnetization direction as the second magnetic layer. Through this, a fabrication process of the buffer memory 1440 may become more simplified and data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising semiconductor memory, wherein the semiconductor memory includes:

a contact plug which is disposed over a substrate and extends in a vertical direction perpendicular to the substrate;
 a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and
 a third magnetic layer which surrounds a sidewall of the contact plug and has the same magnetization direction as the second magnetic layer,
 wherein the third magnetic layer offsets an influence of a magnetic field generated by the second magnetic layer.

2. The electronic device of claim 1, wherein the magnetization directions of the first magnetic layer, the second magnetic layer and the third magnetic layer are parallel to the vertical direction.

3. The electronic device of claim 2, wherein, along a vertical axis penetrating through the variable resistance element and the contact plug, a direction of a magnetic field generated by the third magnetic layer is opposite to that generated by the second magnetic layer.

4. The electronic device of claim 1, wherein a width of the variable resistance element is smaller than a width of an outer circumference of the third magnetic layer in a horizontal direction which is parallel to a surface of the substrate.

5. The electronic device of claim 1, wherein a top surface of the third magnetic layer is positioned at a level that is the same as or lower than a top surface of the contact plug in the vertical direction.

6. The electronic device of claim 1, wherein a bottom surface of the third magnetic layer is positioned at a level higher than a bottom surface of the contact plug in the vertical direction.

7. The electronic device of claim 1, wherein a width of the variable resistance element is the same as a width of the contact plug in a horizontal direction which is parallel to a surface of the substrate.

8. The electronic device of claim 1, wherein the semiconductor memory further includes:
 a plurality of additional variable resistance elements;
 a plurality of additional contact plugs, wherein each of the plurality of additional contact plugs is coupled to each of the plurality of additional variable resistance elements; and
 a plurality of additional third magnetic layers, wherein each of the plurality of additional third magnetic layers surrounds a sidewall of each of the plurality of additional contact plugs.

9. The electronic device of claim 1, wherein the semiconductor memory further includes:
 a plurality of additional variable resistance elements; and
 a plurality of additional contact plugs, wherein each of the plurality of additional contact plugs is coupled to each of the plurality of additional variable resistance elements, and
 wherein the third magnetic layer surrounds sidewalls of the contact plug and the plurality of additional contact plugs.

10. The electronic device of claim 1, wherein the semiconductor memory further includes:
 an additional contact plug; and
 an additional variable resistance element which is coupled to the additional contact plug, and includes a first additional magnetic layer having a variable magnetization direction, a second additional magnetic layer having a pinned magnetization direction, and an additional tunnel barrier layer interposed between the first additional magnetic layer and the second additional magnetic layer wherein the additional contact plug is adjacent to the third magnetic layer.

11. The electronic device of claim 10, wherein a sidewall of the additional contact plug is not surrounded by a magnetic material.

12. The electronic device of claim 10, wherein the third magnetic layer offsets an influence of a magnetic field generated by the second additional magnetic layer.

13. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

14. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

15. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

16. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

17. An electronic device comprising semiconductor memory, wherein the semiconductor memory includes:
   a contact plug which is disposed over a substrate and extends in a vertical direction perpendicular to the substrate;
   a variable resistance element which is coupled to the contact plug and includes a first magnetic layer having a variable magnetization direction, a second magnetic layer having a pinned magnetization direction, and a tunnel barrier layer interposed between the first magnetic layer and the second magnetic layer; and
   a third magnetic layer which surrounds a sidewall of the contact plug and has the same magnetization direction as the second magnetic layer,
   wherein the semiconductor memory further includes:
   a plurality of additional variable resistance elements; and
   a plurality of additional contact plugs, wherein each of the plurality of additional contact plugs is coupled to each of the plurality of additional variable resistance elements, and
   wherein the third magnetic layer surrounds sidewalls of the contact plug and the plurality of additional contact plugs.

18. An electronic device comprising a semiconductor memory, wherein the semiconductor memory includes:
   a substrate;
   an interlayer dielectric layer over the substrate;
   contact plugs formed in the interlayer dielectric layer over the substrate, each contact plug being electrically conductive;
   magnetic regions formed in the interlayer dielectric layer and respectively formed to surround the contact plugs so that each contact plug is surrounded by a corresponding magnetic region; and
   variable resistance elements respectively formed over the contact plugs, each variable resistance element being in electrical contact with a corresponding contact plug, and each variable resistance element including a first magnetic layer having a variable magnetization direction, a second magnetic layer having a pinned magnetization direction, and a tunnel barrier layer interposed between the first magnetic layer and the second magnetic layer,
   wherein the magnetic regions and the variable resistance elements are structured so that each magnetic region surrounding a corresponding contact plug has a magnetization direction to produce a magnetic field in a direction opposite to a direction of another magnetic field produced by the second magnetic layer of the corresponding variable resistance element along a vertical axis penetrating through the corresponding contact plug and the corresponding variable resistance element.

19. The electronic device of claim 18, wherein,
   the magnetization of the first magnetic layer is perpendicular to the first magnetic layer; and
   the magnetization of the second magnetic layer is perpendicular to the first magnetic layer.

20. The electronic device of claim 19, wherein each magnetic region surrounds an uppermost part of a corresponding contact plug.

* * * * *